United States Patent [19]
McClure et al.

[11] Patent Number: 5,373,111
[45] Date of Patent: Dec. 13, 1994

[54] BOND PAD HAVING A PATTERNED BONDING SURFACE

[75] Inventors: Kevin E. McClure; Thomas P. Douglas; Larry W. Houk, all of Kokomo, Ind.

[73] Assignee: Delco Electronics Corporation, Kokomo, Ind.

[21] Appl. No.: 154,763

[22] Filed: Nov. 19, 1993

[51] Int. Cl.$^5$ .................................. H05K 1/100
[52] U.S. Cl. ................... 174/250; 174/261; 29/832; 29/842; 361/767; 361/808
[58] Field of Search .............. 174/257, 261, 250, 255; 361/760, 767, 771, 779, 808; 29/832, 834, 842, 840, 740, 867, 879; 228/49.5; 294/902

[56] References Cited
U.S. PATENT DOCUMENTS

| | | |
|---|---|---|
| 2,431,393 | 11/1947 | Franklin . |
| 3,072,500 | 1/1963 | Berlinghof . |
| 4,366,342 | 12/1982 | Breedlore ............... 174/52 FP |
| 4,992,908 | 2/1991 | Soloman ................ 361/400 |
| 5,291,371 | 3/1994 | Mukai ................... 361/760 |
| 5,298,685 | 3/1994 | Bindra et al. .......... 174/250 |

Primary Examiner—Gerald P. Tolin
Assistant Examiner—L. Thomas
Attorney, Agent, or Firm—Mark A. Navarre

[57] ABSTRACT

A bond pad is provided for improving the reliability of the bond joints between a surface-mounted integrated circuit package and a conductor on a circuit board substrate. In particular, the reliability of the bond joints is promoted by preventing the bond pad from being placed upside down on the conductor, wherein a material mismatch occurs between the bond pad and the aluminum alloy wire used to electrically connect the package leads to the bond pad, and between the bond pad and the conductor patterned on the substrate. To avoid such a mismatch, the bond pad is configured such that it cannot be picked up with conventional vacuum-operated pick and place devices when delivered upside down to the loading station. As a result, only properly oriented bond pads will be placed on the circuit board, such that the bond pad properly presents the appropriate bond surfaces to the conductor and wire during assembly.

14 Claims, 2 Drawing Sheets

BOND PAD HAVING A PATTERNED BONDING SURFACE

The present invention generally relates to bond pads used to electrically interconnect integrated circuit packages to conductor patterns formed on substrates and printed circuit boards. More particularly, this invention relates to a bond pad which is configured to facilitate its proper handling during the manufacture of a hybrid integrated circuit, such that the bond pad will be appropriately mated with the conductor pattern as well as the electrical lead which interconnects the bond pad with the integrated circuit package.

BACKGROUND OF THE INVENTION

Hybrid integrated circuits used in automotive applications often employ surface-mounted integrated circuit packages. Such packages are typically electrically interconnected with their respective conductors on the substrate of the hybrid integrated circuit using wire bonding techniques, in which a very thin electrically-conductive wire is bonded to the lead of the package and to a bond pad soldered to the conductor. Bond pads serve to promote a durable and reliable bond with the wire, which is typically an aluminum alloy, and with the conductor. The conductor is typically formed from a different material than that of the wire. Common conductor materials are silver and silver alloys such as a silver-palladium alloy, though the use of other metals such as copper or a copper alloy is also known for this purpose.

In order to be compatible with the two different materials used for the wire and conductor, the two bonding surfaces of conventional bond pads are typically composed of different materials, each of which is compatible with either the wire material or the conductor material. Because the wire material is typically an aluminum alloy and the conductor material is typically silver or a silver alloy, prior art bond pads are typically composed of a multi-layer structure wherein an intermediate steel substrate is layered with aluminum or an aluminum alloy on one side to bond to the wire bond, and layered with copper or a copper alloy on the opposite side to bond with the silver or silver alloy conductor. Such bond pads may be on the order of about 0.25 millimeter thick, with the steel substrate accounting for about 0.15 to about 0.18 millimeter of that thickness. The thickness of the aluminum alloy layer may be on the order of about 25 to about 75 micrometers, while a thinner layer of copper is typically used, on the order of about 25 to about 50 micrometers. Bond pads of this type are placed with the copper layer face down on the conductor, in order to allow soldering of the copper layer to the silver or silver alloy conductor. Consequently, the bond pad is oriented such that the aluminum alloy layer is face up, in order to allow bonding of the aluminum alloy layer to the aluminum wire.

Due to the small size of integrated circuit packages and the numerous leads typically required for such packages, the maximum allowable size for a bond pad is often severely restricted. As an example, bond pads are typically on the order of about two millimeters to a side, though the size may vary depending on the application. The extremely small size of bond pads complicates their handling and placement during assembly, which typically is done by vacuum-operated pick-and-place devices. In particular, it has been found that bond pads are occasionally placed upside down on the conductor pattern. When this occurs, the aluminum alloy layer is mated with the silver or silver alloy conductor, and the copper alloy layer is mated with the aluminum wire, such that reliable and durable bonds are unlikely to be produced due to the material mismatch of the bond surfaces during soldering or bonding. As a result, the integrity of the bonds suffer.

Thus, it would be desirable if the occurrence of upside down bond pads could be substantially reduced if not eliminated during the assembly of a hybrid integrated circuit. A suitable solution would not significantly complicate the manufacturing or handling of the bond pad, nor have a detrimental effect on the ability of the bond pad to form high integrity bonds with the wire and conductor. Furthermore, the solution must be highly repeatable and reliable when used in mass production, particularly for the manufacture of electronic hardware for the automotive industry.

SUMMARY OF THE INVENTION

It is an object of this invention to provide a bond pad which is suitable for use in a hybrid integrated circuit for the purpose of providing an intermediate bond member between a conductor patterned on the substrate of the hybrid integrated circuit and a wire which serves to electrically interconnect an integrated circuit package to the conductor.

It is a further object of this invention that such a bond pad be configured so as to substantially reduce the likelihood that the bond pad will be placed upside down on the conductor during component assembly of the hybrid integrated circuit.

It is still a further object of this invention that such a bond pad be readily manufacturable.

In accordance with a preferred embodiment of this invention, these and other objects and advantages are accomplished as follows.

According to the present invention, there is provided a bond pad for electrically interconnecting an integrated circuit package lead to a conductor pattern for a hybrid integrated circuit. The bond pad of this invention is formed from an aluminum clad copper alloy, eliminating the steel substrate conventionally used in the prior art. Furthermore, a sufficiently thick copper alloy layer is provided in order to allow surface irregularities to be formed in the lower surface of the bond pad defined by the copper alloy layer. More specifically, the surface irregularities alter the lower surface of the bond pad from the smooth, planar surface conventionally seen on bond pads. The surface irregularities are formed in order to interfere with the creation of a vacuum at the lower surface of the bond pad, by which the bond pad could otherwise be lifted using a vacuum-operated device. Consequently, during the component assembly of the hybrid integrated circuit, on the occasion that a bond pad is inadvertently fed upside down to the loading station, the vacuum-operated device would be prevented from gripping and lifting the bond pad at its lower surface. As a result, the bond pad of this invention is configured to promote the proper delivery of the bond pad to its conductor, in a right side up orientation, so that the "bottom" copper surface of the bond pad contacts the conductor, and the "top" aluminum clad surface of the bond pad is available for bonding with the aluminum wire. The potential for placing the bond pad on the hybrid circuit with its aluminum clad surface against the conductor is therefore significantly reduced.

Surface irregularities which are capable of preventing the creation of a vacuum between the vacuum-operated device and the bond pad can potentially take many forms. Suitable configurations include numerous peaks and valleys formed in a repetitive or an irregular pattern on the lower surface, and elongated trenches and/or elongated peaks that extend across the lower surface of the bond pad. Generally, surface configurations which are suitable from the perspective of this invention are characterized by one or more peaks and/or valleys, wherein the height differential between adjacent peaks and valleys is sufficient to prevent the creation of a vacuum at the lower surface which would be sufficient to lift the bond pad. In addition, in order to assure a reliable bond between the bond pad and the conductor, the thickness of the copper alloy layer must be sufficient such that the desired surface irregularities are formed entirely within the copper alloy layer, and do not extend into the aluminum alloy cladding.

The processing and handling of the bond pad of this invention is otherwise conventional. The bond pad can be soldered to the conductor using soldering methods known to the prior art, and the wire can be bonded to the bond pad and package lead using wire bonding methods which are also known to the art.

Primarily then, the advantages made possible by the novel bond pad of this invention include more reliable and durable bond joints, and therefore a more reliable and durable electrical path between the bond pad and the wire and conductor, such that likelihood of failure of the bond joints is significantly reduced. As a result, the reliability of the integrated circuit package, as well as the entire hybrid integrated circuit, is improved. The enhanced reliability of the bond joints is particularly desirable when used in an automotive environment, where electronic components are required to survive numerous repeated thermal cycles and road vibrations.

In addition, though the bond pad is particularly suited for use with surface-mounted integrated circuit packages employed in hybrid integrated circuits, the advantages of this invention can be readily applied by those skilled in the art to he mounting of various circuit devices on printed circuit boards.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings wherein.

DETAILED DESCRIPTION OF THE INVENTION

A bond pad is provided for improving the reliability of the bond joints between a surface-mounted integrated circuit package and a conductor on a circuit board substrate. In particular, the reliability of the bond joints is promoted by preventing the bond pad from being placed upside down on the conductor, wherein a material mismatch occurs between the bond pad and the wire used to electrically interconnect the package lead to the bond pad, and between the bond pad and the conductor to which it is bonded. To avoid such a mismatch, the bond pad is configured such that it can only be lifted by conventional vacuum-operated pick and place devices when it is delivered right side up to the loading station, such that the bond pad properly presents compatible bond surfaces to the conductor and wire during assembly. In particular, the bond pad is configured such that the pick and place device will be unable to lift a bond pad which is delivered upside down to the loading station.

Figure 1:
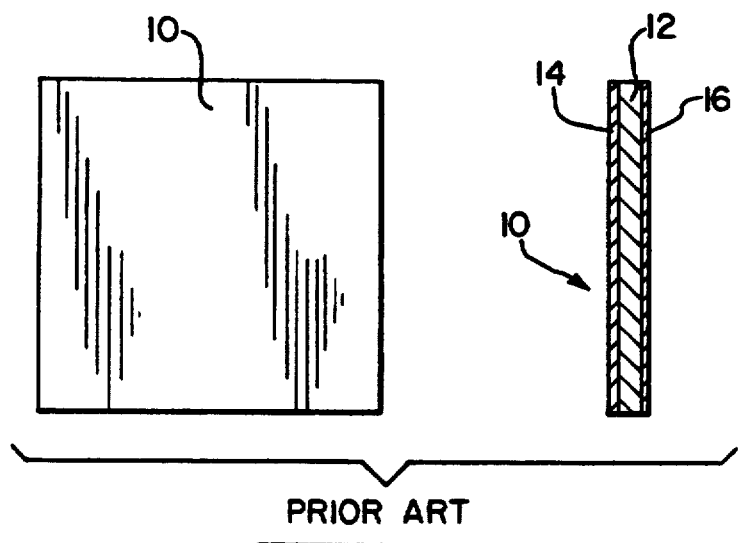
FIG. 1 shows plan and cross-sectional views of a bond pad of the type known and used in the prior art for bonding the leads of a surface-mounted integrated circuit package to a conductor formed on a hybrid integrated circuit board.

FIG. 1 illustrates a conventional bond pad 10 used to electrically connect a surface-mounted integrated circuit package (not shown) to a conductor (not shown) of a hybrid integrated circuit. Bond pads of this type are also suited for electrically connecting components to a lead frame, such as for input-output capabilities. Conventionally, such a bond pad 10 includes a steel substrate 12 whose thickness is on the order of about 0.15 to about 0.18 millimeter. On one surface of the substrate 10 there is provided an aluminum alloy layer 14, while a copper or copper alloy layer 16 is provided on the opposite surface of the substrate 12. The aluminum alloy layer 14 and copper layer 16 serve to provide a material match with the aluminum alloy wire and the silver or silver alloy conductor, respectively, which are typically used with conventional hybrid integrated circuits. By appropriately matching the materials to be bonded in this manner, the strength of the bonds formed between the wire and bond pad, and between the conductor and bond pad is promoted. Bond pads of this type must be placed with the copper layer 16 face down on the conductor in order for the copper layer 16 to be appropriately bonded to the conductor. Correspondingly, the aluminum alloy layer 14 must be placed face up in order for the aluminum alloy layer 14 to be appropriately bonded to the aluminum wire. Because the opposite surfaces of the bond pad 10 are physically identical, in that they are both planar and relatively smooth, conventional pick and place devices cannot differentiate whether the bond pad 10 is properly oriented prior to being placed on the conductor. Accordingly, bond pads 10 of this type are occasionally placed upside down on the conductor, creating a mismatch between the materials of the members to be bonded. When this occurs, inadequate bonds are formed.

Figure 2A:
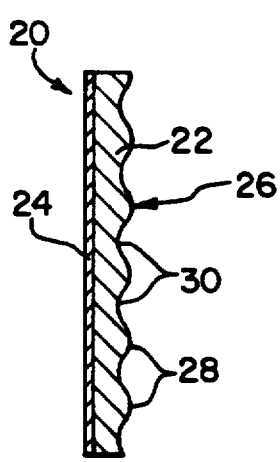
FIG. 2 shows a perspective view and a cross-sectional view of a bond pad formed in accordance with a first embodiment of this invention.
Figure 2B:
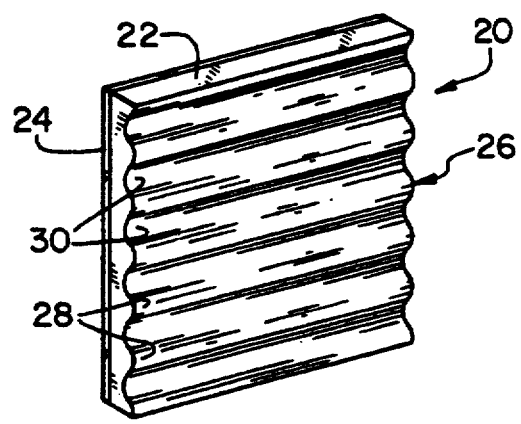

In contrast to the prior art bond pad 10 shown in FIG. 1, FIG. 2 illustrates a bond pad 20 configured in accordance with this invention. As shown, the bond pad 20 is generally planar and has a square shape, though other shapes are possible and known, including rectangular and circular-shaped bond pads. The bond pad 20 is preferably formed to have an upper surface defined by an aluminum alloy layer 24, while its lower surface is preferably defined by a copper alloy layer 22. However, the steel substrate 12 of the prior art bond pad 10 is eliminated from the preferred bond pad 20 of this invention. Instead, the bond pad 20 is preferably formed from an alloy which is clad with an aluminum alloy, in which the alloy is suitable for soldering with the silver or silver alloy conductor, and also has a coefficient of thermal expansion which approximates that of the aluminum cladding alloy. A preferred material for the bond pad 20 of this invention is the copper-zinc alloy C19400 overlayed with a cladding layer of AA type 1100 aluminum alloy. Another copper-base alloy which may be used to form the copper alloy layer 22 is the C72500 alloy, which has as a nominal composition, in weight percent, about 88.2 percent copper, 9.5 percent nickel and about 2.3 percent tin. An alternative material for the preferred copper alloy layer 22 is an iron-nickel alloy available under the designation A45 C from Carpenter Technology Corporation of Reading, Pa. The A45 C alloy has a nominal composition of, in weight percent, about 44.5 to about 45.5 percent nickel, about 0.50 percent manganese (maximum), about 0.50 percent cobalt (maximum), about 0.30 percent silicon (maximum), about 0.25 percent chromium (maximum), about 0.20 percent molybdenum (maximum), about 0.20 percent copper (maximum), about 0.05 percent carbon (maximum), about 0.02 percent phosphorus (maximum), and about 0.01 percent sulfur (maximum), with the balance being iron. Although it is understood that other suitable materials may also be used.

The surface area of the bond pad 20, as defined by the copper and aluminum alloy layers 22 and 24, may vary in accordance with the size of the conductor to which the bond pad 20 is to be soldered. Bond pads 20 measuring approximately two millimeters on a side are generally conventional and suitable, however the dimensions of the bond pad may vary greatly depending on the particular application. The overall thickness of the bond pad 20 may also be appropriately sized to be compatible with a particular application, but most typically will be in the range of about 0.2 to about 1.0 millimeter. The aluminum alloy layer 14 is preferably about 0.02 to about 0.2 millimeter thick, and more preferably at least about 0.05 millimeter thick in order to alloy sufficient material for producing an acceptable bond, or more precisely, a suitable weld between the bond pad 20 and the aluminum alloy wire. Preferably, the copper alloy layer 22 is about 0.1 to about 0.8 millimeter thick, and more preferably at least about 0.2 millimeter thick. A suitable thickness for the copper alloy layer 22 employed by this invention is necessary not only to provide sufficient material for joining with the conductor, but also to allow the formation of a surface pattern 26 on the lower surface of the bond pad 20 formed by the copper alloy layer 22.

In accordance with the objects of this invention, the pattern 26 formed on the lower surface of the bond pad 20 can have numerous configurations, each of which generally involves the formation of recessed regions, or valleys formed in the surface of the copper alloy layer 22, which defines raised regions, or peaks, on the surface of the copper alloy layer 22. As noted above, one limitation of the pattern 26 is that it be formed entirely within the copper alloy layer 22, so as to assure a reliable bond between the bond pad 20 and the conductor. However, a more fundamental consideration is that the pattern 26 be characterized by surface features which produce a height differential between adjacent peaks and valleys which is sufficient to interfere with the creation of a vacuum at the surface of the copper alloy layer 22 with a vacuum-operated pick and place device. As is known in the art, such devices are used in manufacturing assembly operations in the electronics industry, and generally include a cylindrical vacuum tube with a planar pick-up surface and an alignment feature for aligning the bond pad with the pick-up surface. By preventing the creation of a vacuum between such a device and the copper alloy layer 22 of the bond pad 20, the bond pad 20 cannot be lifted by its surface defined by the copper alloy layer 22. During assembly, such an occasion arises only if the bond pad 20 is delivered to the pick and place device upside down, with the pattern 26 facing up. Consequently, only those bond pads 20 which are properly oriented, with the relatively smooth surface provided by the aluminum alloy layer 24 facing up, can be loaded by the pick and place device onto a circuit board. In turn, the above constraint assures that each bond pad 20 will be placed with its copper alloy layer 22 face down on its corresponding conductor, so as to promote the formation of a reliable bond between the bond pad 20 and the conductor, as well as a reliable weld between the bond pad 20 and its corresponding wire.

As shown in FIG. 2, a suitable pattern 26 for purposes of this invention includes a corrugated configuration in which a repetitive pattern of peaks 28 and valleys 30 extend across the entire surface of the copper alloy layer 22. In the embodiment shown in FIG. 2, each peak 28, which is essentially an elongated ridge on the surface of the bond pad 20, and each valley 30, which is essentially an elongated trough on the surface of the bond pad 20, is parallel to an edge of the bond pad 20. For this configuration, a preferred minimum height difference between adjacent peaks 28 and valleys 30 is about 0.07 millimeter, though a range of about 0.01 to about 0.25 millimeter is considered suitable in order to meet the functional requirement noted above. In addition, a distance between peaks of about 0.1 to about 1.0 millimeter, and preferably about 0.35 millimeter, appears to be suitable for a bond pad 20 whose size is a few millimeters per side. The surface pattern 26 shown in FIG. 2 is preferably formed by cold or hot rolling the pattern 26 in the bond pad 20. For convenience, the pattern 26 can be imprinted during the cladding operation prior to the separation of individual bond pads 20 from the composite strip composed of the aluminum alloy clad material. Those skilled in the art will recognize that numerous other techniques are available for forming a suitable pattern 26 in the copper alloy layer 22, such as by electrical discharge machining (EDM).

Figure 3A:
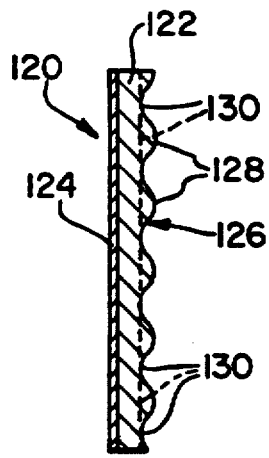
FIGS. 3 and 4 show perspective and cross-sectional views of bond pads in accordance with second and third embodiments of this invention.
Figure 3B:
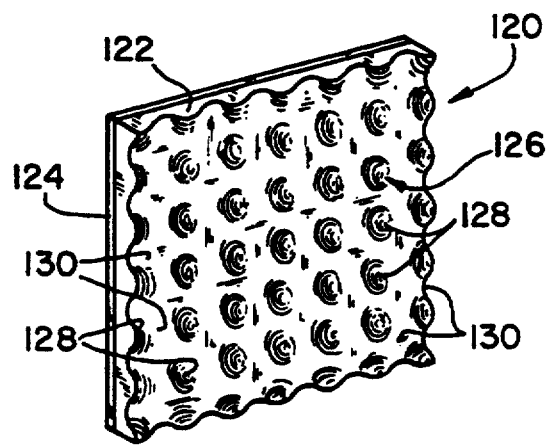
Figure 4A:
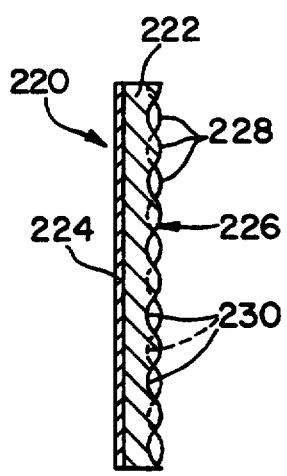
Figure 4B:
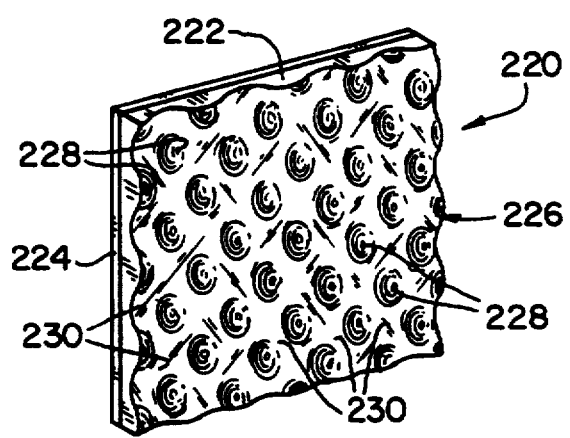

FIGS. 3 and 4 illustrate two alternative patterns which are also suitable as surface patterns for this invention. FIG. 3 illustrates a bond pad 120 whose surface pattern 126 is composed of a first corrugated pattern, such as the peak and valley pattern of FIG. 2, on which is superimposed a second peak and valley pattern oriented approximately 90 degrees to the first pattern. The resulting pattern 126 is characterized by individual peaks 128 and valleys 130, as opposed to the elongated peaks 28 and valleys 30 shown in FIG. 2. FIG. 4 illustrates a third embodiment, in which the peak and valley pattern of FIG. 3 is rotated roughly 45 degrees on the bond pad 220, so as to form individual peaks 228 and valleys 230 which define a diagonal surface pattern 226. It should be noted that numerous additional pattern variations are possible, in addition to those shown in FIGS. 2 through 4, such that the configuration of a bond pad formed in accordance with this invention is not to be limited to the embodiments illustrated.

As is conventional with hybrid integrated circuits which include an integrated circuit package, a number of bond pads 20, 120 and/or 220 are used to secure and electrically connect the package to its corresponding conductor pattern on the surface of the circuit substrate.

Each bond pad 20, 120 and/or 220 is secured to its corresponding conductor with a suitable solder compound, such as (by weight percentages) a 60/40, 30/70 or 25/75 tin-leaded solder compound, or a 60/37/3 tin-lead-silver solder compound, or a 595 copper solder, each of which are known and used for electronic applications, although it is to be noted that other suitable materials may also be used. Typically, a flux will be used in conjunction with the solder compound to promote the soldering process by aiding the flow of the solder and preventing the formation of oxides on the metal surfaces being soldered. Such solder compositions are readily applied to the conductors as a tacky paste, with the bond pads 20, 120 and/or 220 being soldered therewith using conventional reflow soldering techniques.

Suitable wire bonding techniques for bonding the wire to the bond pad 20, 120 or 220 and the corresponding package lead are also known in the art. An example is the thermocompression wire bonding technique which generally involves the use of a temperature and pressure combination to form welds that otherwise would not form if the temperature or pressure were used alone. In that such techniques are known in the art, and do not constitute the subject matter of this invention, further discussion of this process will not be provided here. However, it is important to note that the formation of reliable welds with a wire is promoted when using one of the bond pads 20, 120 and 120 of this invention, in that the proper orientation of the bond pad 20, 120 or 220 is assured when placed on the conductor because the bond pad 20, 120 or 220 can only be lifted and placed with conventional pick and place equipment when the bond pad 20, 120 or 220 is properly delivered to the loading station, with the aluminum alloy layer 24, 124 or 224 lying face up.

From the above, it can be seen that a significant advantage of using a bond pad configured in accordance this invention is that the integrity of the bond joints formed between the bond pad and its corresponding wire and conductor can be significantly enhanced, in terms of the reliability and durability of the bond joints. This enhancement is made possible by practically eliminating the potential for an improperly oriented bond pad on its conductor, such that a mismatch is avoided between the bonding surfaces of the bond pad and their corresponding wire or conductor. More specifically, the pattern formed on the lower surface of the bond pad is such that a vacuum-operated pick and place device of the type conventionally used to deliver and place the bond pad on the conductor cannot create the required vacuum with the pattern. As a result, the vacuum device cannot lift the bond pad when it is delivered upside down, with the pattern facing up. Consequently, only those bond pads which are properly oriented, with the smooth surface provided by the aluminum alloy layer facing up, can be loaded by the vacuum device onto the circuit board. With proper orientation of the bond pad, the integrity of the bonds formed with the conductor and the wire are limited only by the proper execution of the bonding techniques employed.

Furthermore, the above advantages attributable to the bond pad of this invention are realized without significantly effecting the methods by which the bonds are formed between the bond pad and the conductor and wire. Nor does the bond pad of this invention significantly effect the processing, handling and loading of the bond pads, other than to enhance the ability to properly orient the bond pad on the conductor. Consequently, the bond pad can be readily used for many applications which require a very small bond pad as an intermediate bond member between two dissimilar materials.

While our invention has been described in terms of a preferred embodiment, it is apparent that other forms could be adopted by one skilled in the art. For example, the pattern defined by the peaks and valleys could be significantly altered from that shown and described, different materials could be substituted for those suggested in order to adapt to the use of different materials for the conductor and wire, the bonding techniques used could differ from those suggested, and the bond pads could be used in applications other than that noted. Accordingly, the scope of our invention is to be limited only by the following claims.

The embodiments of the invention in which an exclusive property or privilege is claimed are defined as follows:

1. A bond pad for electrically interconnecting an integrated circuit package lead to a conductor pattern, said bond pad comprising:
   a pad comprising a first layer of a first metal alloy and a second layer of a second metal alloy, said first layer defining a first surface of said pad, and said second layer defining a second surface of said pad for bonding to said conductor pattern; and
   surface features formed in said second surface of said pad for interrupting a vacuum applied to said second surface so as to prevent a vacuum-operated device from selectively engaging and lifting said bond pad from said second surface;
   whereby an appropriate orientation of said bond pad for proper bonding of said second surface to said conductor pattern is promoted, in that said bond pad cannot be selectively lifted with said vacuum-operated device from said second surface, thereby reducing the likelihood of placing said bond pad on said conductor pattern such that said first surface faces said conductor pattern.

2. A bond pad as recited in claim 1 wherein said surface features comprise peaks and valleys formed in said second surface, the height of a peak above an adjacent valley being sufficient to interrupt said vacuum applied to said second surface by said vacuum-operated device.

3. A bond pad as recited in claim 2 wherein said height of said peak above said adjacent valley is about 0.01 to about 0.25 millimeter.

4. A bond pad as recited in claim 2 wherein said peaks comprise ridges extending across said second surface, and wherein said valleys comprise troughs extending across said second surface.

5. A bond pad as recited in claim 1 wherein said surface features define a corrugated pattern on said second surface.

6. A bond pad as recited in claim 1 wherein said first layer has a thickness of about 0.02 to about 0.2 millimeter.

7. A bond pad as recited in claim 1 wherein said second layer has a thickness of about 0.01 to about 0.8 millimeter.

8. A bond pad for electrically interconnecting an integrated circuit package lead to a conductor pattern, said bond pad comprising:
   a pad comprising an aluminum alloy layer which is clad to a copper alloy layer, said aluminum alloy layer defining an upper surface of said pad and said copper alloy layer defining a lower surface of said pad; and a repetitive pattern formed in said lower surface of said pad for interrupting a vacuum applied to said lower surface so as to prevent a vacuum-operated device from selectively engaging and gripping said bond pad at said lower surface;

whereby an appropriate orientation of said bond pad for proper bonding of said lower surface to said conductor pattern is promoted, in that said bond pad cannot be selectively lifted with said vacuum-operated device from said lower surface, thereby reducing the likelihood of placing said bond pad on said conductor pattern such that said upper surface faces said conductor pattern.

9. A bond pad as recited in claim 8 wherein said repetitive pattern comprises peaks and valleys formed in said lower surface, the height of a peak above an adjacent valley being sufficient to interrupt said vacuum applied to said lower surface by said vacuum-operated device.

10. A bond pad as recited in claim 9 wherein said height of said peak above said adjacent valley is about 0.01 to about 0.25 millimeter.

11. A bond pad as recited in claim 9 wherein said peaks comprise ridges extending across said lower surface, and wherein said valleys comprise troughs extending across said lower surface.

12. A bond pad as recited in claim 8 wherein said repetitive pattern comprises a corrugated pattern formed on said lower surface.

13. A bond pad as recited in claim 8 wherein said aluminum alloy layer has a thickness of about 0.02 to about 0.2 millimeter.

14. A bond pad as recited in claim 1 wherein said copper alloy layer has a thickness of about 0.01 to about 0.8 millimeter.

* * * * *